(12) United States Patent
Okhonin et al.

(10) Patent No.: US 7,477,540 B2
(45) Date of Patent: Jan. 13, 2009

(54) BIPOLAR READING TECHNIQUE FOR A MEMORY CELL HAVING AN ELECTRICALLY FLOATING BODY TRANSISTOR

(75) Inventors: Serguei Okhonin, Lausanne (CH); Mikhail Nagoga, Pully (CH)

(73) Assignee: Innovative Silicon ISi SA, Lausanne (CH)

( * ) Notice: Subject to any disclaimer, the term of this patent is extended or adjusted under 35 U.S.C. 154(b) by 0 days.

(21) Appl. No.: 11/906,036

(22) Filed: Sep. 28, 2007

(65) Prior Publication Data
US 2008/0025083 A1 Jan. 31, 2008

Related U.S. Application Data

(62) Division of application No. 11/304,387, filed on Dec. 15, 2005, now Pat. No. 7,301,803.

(60) Provisional application No. 60/638,663, filed on Dec. 22, 2004.

(51) Int. Cl.
*G11C 11/34* (2006.01)

(52) U.S. Cl. .................. 365/177; 365/179; 365/185.01; 365/185.26

(58) Field of Classification Search ................ 653/177; 365/177, 179, 185.01, 185.26
See application file for complete search history.

(56) References Cited
U.S. PATENT DOCUMENTS

| | | | |
|---|---|---|---|
| 3,439,214 A | 4/1969 | Kabell | |
| 3,997,799 A | 12/1976 | Baker | |
| 4,032,947 A | 6/1977 | Kesel et al. | |
| 4,250,569 A | 2/1981 | Sasaki et al. | |

(Continued)

FOREIGN PATENT DOCUMENTS

EP 0 030 856 6/1981

(Continued)

OTHER PUBLICATIONS

"A Capacitorless Double-Gate DRAM Cell", Kuo et al., IEEE Electron Device Letters, vol. 23, No. 6, Jun. 2002, pp. 345-347.

(Continued)

*Primary Examiner*—Thong Q Le
(74) *Attorney, Agent, or Firm*—Neil A. Steinberg

(57) ABSTRACT

A technique of sampling, sensing, reading and/or determining the data state of a memory cell (of, for example, a memory cell array) including an electrically floating body transistor. In this regard, the intrinsic bipolar transistor current component is employed to read and/or determine the data state of the electrically floating body memory cell. During the read operation, the data state is determined primarily by or read (or sensed) substantially using the bipolar current component responsive to the read control signals and significantly less by the interface channel current component, which is negligible relative to the bipolar component. The bipolar transistor current component may be very sensitive to the floating body potential due to the high gain of the intrinsic bipolar transistor of the electrically floating body transistor. As such, the programming window obtainable with this reading technique may be considerably higher than the programming window employing a conventional reading technique (which is based primarily on the interface channel current component).

33 Claims, 11 Drawing Sheets

U.S. PATENT DOCUMENTS

| | | | |
|---|---|---|---|
| 4,262,340 A | 4/1981 | Sasaki et al. | |
| 4,298,962 A | 11/1981 | Hamano et al. | |
| 4,371,955 A | 2/1983 | Sasaki | |
| 4,527,181 A | 7/1985 | Sasaki | |
| 4,630,089 A | 12/1986 | Sasaki et al. | |
| 4,791,610 A | 12/1988 | Takemae | |
| 4,954,989 A | 9/1990 | Auberton-Herve et al. | |
| 4,979,014 A | 12/1990 | Hieda et al. | |
| 5,144,390 A | 9/1992 | Matloubian | |
| 5,164,805 A | 11/1992 | Lee | |
| 5,258,635 A | 11/1993 | Nitayama et al. | |
| 5,388,068 A | 2/1995 | Ghoshal et al. | |
| 5,446,299 A | 8/1995 | Acovic et al. | |
| 5,448,513 A | 9/1995 | Hu et al. | |
| 5,466,625 A | 11/1995 | Hsieh et al. | |
| 5,489,792 A | 2/1996 | Hu et al. | |
| 5,528,062 A | 6/1996 | Hsieh et al. | |
| 5,568,356 A | 10/1996 | Schwartz | |
| 5,593,912 A | 1/1997 | Rajeevakumar | |
| 5,606,188 A | 2/1997 | Bronner et al. | |
| 5,608,250 A | 3/1997 | Kalnitsky | |
| 5,627,092 A | 5/1997 | Alsmeier et al. | |
| 5,631,186 A | 5/1997 | Park et al. | |
| 5,696,718 A | 12/1997 | Hartmann | |
| 5,740,099 A | 4/1998 | Tanigawa | |
| 5,778,243 A | 7/1998 | Aipperspach et al. | |
| 5,780,906 A | 7/1998 | Wu et al. | |
| 5,784,311 A | 7/1998 | Assaderaghi et al. | |
| 5,811,283 A | 9/1998 | Sun | |
| 5,877,978 A | 3/1999 | Morishita et al. | |
| 5,886,376 A | 3/1999 | Acovic et al. | |
| 5,886,385 A | 3/1999 | Arisumi et al. | |
| 5,897,351 A | 4/1999 | Forbes | |
| 5,929,479 A | 7/1999 | Oyama | |
| 5,930,648 A | 7/1999 | Yang | |
| 5,936,265 A | 8/1999 | Koga | |
| 5,939,745 A | 8/1999 | Park et al. | |
| 5,943,258 A | 8/1999 | Houston et al. | |
| 5,943,581 A | 8/1999 | Lu et al. | |
| 5,960,265 A | 9/1999 | Acovic et al. | |
| 5,968,840 A | 10/1999 | Park et al. | |
| 5,977,578 A | 11/1999 | Tang | |
| 5,982,003 A | 11/1999 | Hu et al. | |
| 6,018,172 A | 1/2000 | Hidada et al. | |
| 6,081,443 A | 6/2000 | Morishita | |
| 6,096,598 A | 8/2000 | Furukawa et al. | |
| 6,097,056 A | 8/2000 | Hsu et al. | |
| 6,111,778 A * | 8/2000 | MacDonald et al. | 365/149 |
| 6,121,077 A | 9/2000 | Hu et al. | |
| 6,157,216 A | 12/2000 | Lattimore et al. | |
| 6,171,923 B1 | 1/2001 | Chi et al. | |
| 6,177,300 B1 | 1/2001 | Houston et al. | |
| 6,177,708 B1 | 1/2001 | Kuang et al. | |
| 6,213,869 B1 | 4/2001 | Yu et al. | |
| 6,214,694 B1 | 4/2001 | Leobandung et al. | |
| 6,225,158 B1 | 5/2001 | Furukawa et al. | |
| 6,245,613 B1 | 6/2001 | Hsu et al. | |
| 6,252,281 B1 | 6/2001 | Yamamoto et al. | |
| 6,292,424 B1 | 9/2001 | Ohsawa | |
| 6,297,090 B1 | 10/2001 | Kim | |
| 6,300,649 B1 | 10/2001 | Hu et al. | |
| 6,320,227 B1 | 11/2001 | Lee et al. | |
| 6,333,532 B1 | 12/2001 | Davari et al. | |
| 6,350,653 B1 | 2/2002 | Adkisson et al. | |
| 6,351,426 B1 | 2/2002 | Ohsawa | |
| 6,359,802 B1 | 3/2002 | Lu et al. | |
| 6,384,445 B1 | 5/2002 | Hidaka et al. | |
| 6,391,658 B1 | 5/2002 | Gates et al. | |
| 6,403,435 B1 | 6/2002 | Kang et al. | |
| 6,421,269 B1 | 7/2002 | Somasekhar et al. | |
| 6,424,011 B1 | 7/2002 | Assaderaghi et al. | |
| 6,424,016 B1 | 7/2002 | Houston | |
| 6,429,477 B1 | 8/2002 | Mandelman et al. | |
| 6,440,872 B1 | 8/2002 | Mandelman et al. | |
| 6,441,435 B1 | 8/2002 | Chan | |
| 6,441,436 B1 | 8/2002 | Wu et al. | |
| 6,466,511 B2 | 10/2002 | Fujita et al. | |
| 6,479,862 B1 | 11/2002 | King et al. | |
| 6,492,211 B1 | 12/2002 | Divakaruni et al. | |
| 6,518,105 B1 | 2/2003 | Yang et al. | |
| 6,531,754 B1 | 3/2003 | Nagano et al. | |
| 6,538,916 B2 | 3/2003 | Ohsawa | |
| 6,544,837 B1 | 4/2003 | Divakaruni et al. | |
| 6,548,848 B2 | 4/2003 | Horiguchi et al. | |
| 6,549,450 B1 | 4/2003 | Hsu et al. | |
| 6,552,398 B2 | 4/2003 | Hsu et al. | |
| 6,556,477 B2 | 4/2003 | Hsu et al. | |
| 6,560,142 B1 | 5/2003 | Ando | |
| 6,566,177 B1 | 5/2003 | Radens et al. | |
| 6,567,330 B2 | 5/2003 | Fujita et al. | |
| 6,590,258 B2 | 7/2003 | Divakauni et al. | |
| 6,590,259 B2 | 7/2003 | Adkisson et al. | |
| 6,617,651 B2 | 9/2003 | Ohsawa | |
| 6,621,725 B2 | 9/2003 | Ohsawa | |
| 6,632,723 B2 | 10/2003 | Watanabe et al. | |
| 6,650,565 B1 | 11/2003 | Ohsawa | |
| 6,714,436 B1 | 3/2004 | Burnett et al. | |
| 6,721,222 B2 | 4/2004 | Somasekhar et al. | |
| 6,825,524 B1 | 11/2004 | Ikehashi et al. | |
| 6,861,689 B2 | 3/2005 | Burnett | |
| 6,897,098 B2 | 5/2005 | Hareland et al. | |
| 6,903,984 B1 | 6/2005 | Tang et al. | |
| 6,909,151 B2 | 6/2005 | Hareland et al. | |
| 6,912,150 B2 | 6/2005 | Portmann et al. | |
| 6,913,964 B2 | 7/2005 | Hsu | |
| 6,980,234 B2 | 12/2005 | Kitawaki | |
| 6,980,243 B2 | 12/2005 | Miyawaki et al. | |
| 7,030,436 B2 | 4/2006 | Forbes | |
| 7,061,806 B2 | 6/2006 | Tang et al. | |
| 7,085,156 B2 | 8/2006 | Ferrant et al. | |
| 7,301,803 B2 | 11/2007 | Okhonin et al. | |
| 7,323,380 B2 | 1/2008 | Forbes | |
| 7,339,830 B2 | 3/2008 | Bhattacharyya | |
| 7,341,904 B2 | 3/2008 | Willer | |
| 2001/0055859 A1 | 12/2001 | Yamada et al. | |
| 2002/0030214 A1 | 3/2002 | Horiguchi | |
| 2002/0034855 A1 | 3/2002 | Horiguchi et al. | |
| 2002/0036322 A1 | 3/2002 | Divakauni et al. | |
| 2002/0051378 A1 | 5/2002 | Ohsawa | |
| 2002/0064913 A1 | 5/2002 | Adkisson et al. | |
| 2002/0070411 A1 | 6/2002 | Vermandel et al. | |
| 2002/0072155 A1 | 6/2002 | Liu et al. | |
| 2002/0076880 A1 | 6/2002 | Yamada et al. | |
| 2002/0086463 A1 | 7/2002 | Houston et al. | |
| 2002/0089038 A1 | 7/2002 | Ning | |
| 2002/0098643 A1 | 7/2002 | Kawanaka et al. | |
| 2002/0110018 A1 | 8/2002 | Ohsawa | |
| 2002/0114191 A1 | 8/2002 | Iwata et al. | |
| 2002/0130341 A1 | 9/2002 | Horiguchi et al. | |
| 2002/0160581 A1 | 10/2002 | Watanabe et al. | |
| 2002/0180069 A1 | 12/2002 | Houston | |
| 2003/0003608 A1 | 1/2003 | Arikado et al. | |
| 2003/0015757 A1 | 1/2003 | Ohsawa | |
| 2003/0035324 A1 | 2/2003 | Fujita et al. | |
| 2003/0057487 A1 | 3/2003 | Yamada et al. | |
| 2003/0057490 A1 | 3/2003 | Nagano et al. | |
| 2003/0102497 A1 | 6/2003 | Fried et al. | |
| 2003/0112659 A1 | 6/2003 | Ohsawa | |
| 2003/0123279 A1 | 7/2003 | Aipperspach et al. | |
| 2003/0146488 A1 | 8/2003 | Nagano et al. | |
| 2003/0151112 A1 | 8/2003 | Yamada et al. | |
| 2004/0108532 A1 | 6/2004 | Forbes | |
| 2005/0001269 A1 | 1/2005 | Hayashi et al. | |
| 2005/0017240 A1 | 1/2005 | Fazan | |

| | | |
|---|---|---|
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0226070 A1 | 10/2005 | Ohsawa |
| 2005/0232043 A1 | 10/2005 | Ohsawa |
| 2006/0091462 A1 | 5/2006 | Okhonin et al. |
| 2006/0098481 A1 | 5/2006 | Okhonin et al. |
| 2006/0126374 A1 | 6/2006 | Waller et al. |

FOREIGN PATENT DOCUMENTS

| | | |
|---|---|---|
| EP | 0 350 057 | 1/1990 |
| EP | 0 354 348 | 2/1990 |
| EP | 0 362 961 | 4/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 642 173 | 3/1995 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | S62-007149 A | 1/1987 |
| JP | 62-272561 | 11/1987 |
| JP | 02-294076 | 2/1991 |
| JP | 03171768 | 7/1991 |
| JP | H04-176163 A | 6/1992 |
| JP | 08213624 | 8/1996 |
| JP | H08-213624 A | 8/1996 |
| JP | 8-274277 | 10/1996 |
| JP | H08-316337 A | 11/1996 |
| JP | 09046688 | 2/1997 |
| JP | 9-82912 | 3/1997 |
| JP | 10242470 | 11/1998 |
| JP | 11-87649 | 3/1999 |
| JP | 247735 | 8/2000 |
| JP | 274221 | 9/2000 |
| JP | 389106 | 12/2000 |
| JP | 180633 | 6/2001 |
| JP | 2002-94027 | 3/2002 |
| JP | 2002-176154 | 6/2002 |
| JP | 2002-246571 | 8/2002 |
| JP | 2002-0981 | 11/2002 |
| JP | 2002-329795 | 11/2002 |
| JP | 2002-343886 | 11/2002 |
| JP | 2002-353080 | 12/2002 |
| JP | 2003-31693 | 1/2003 |
| JP | 2003-68877 A | 3/2003 |
| JP | 2003-86712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |

OTHER PUBLICATIONS

"The Multi-Stable Behaviour of SOI-NMOS Transistors at Low Temperatures", Tack et al., Proc. 1988 SOS/SOI Technology Workshop (Sea Palms Resort, St. Simons Island, GA, Oct. 1988), p. 78.

"The Multistable Charge-Controlled Memory Effects in SOI MOS Transistors at Low Temperatures", Tack et al., IEEE Transactions on Electron Devices, vol. 37, No. 5, May 1990, pp. 1373-1382.

"Mechanisms of Charge Modulation in the Floating Body of Triple-Well nMOSFET Capacitor-less DRAMs", Villaret et al., Proceedings of the INFOS 2003, Insulating Films on Semiconductors, 13th Bi-annual Conference, Jun. 18-20, 2003, Barcelona (Spain), (4 pages).

"A Memory Using One-Transistor Gain Cell on SOI (FBC) with Performance Suitable for Embedded DRAM's", Ohsawa et al., 2003 Symposium on VLSI Circuits Digest of Technical Papers, Jun. 2003 (4 pages).

FBC (Floating Body Cell) for Embedded DRAM on SOI, Inoh et al., 2003 Symposium on VLSI Circuits Digest of Technical Papers, Jun. 2003 (2 pages).

"Toshiba's DRAM Cell Piggybacks on SOI Wafer", Y. Hara, EE Times, Jun. 2003.

"Memory Design Using a One-Transistor Gain Cell on SOI", Ohsawa et al., IEEE Journal of Solid-State Circuits, vol. 37, No. 11, Nov. 2002, pp. 1510-1522.

"Opposite Side Floating Gate SOI Flash Memory Cell", Lin et al., IEEE, Mar. 2000, pp. 12-15.

"Advanced TFT SRAM Cell Technology Using a Phase-Shift Lithography", Yamaneka et al., IEEE Transactions on Electron Devices, vol. 42, No. 7, Jul. 1995, pp. 1305-1313.

"Soft-Error Characteristics in Bipolar Memory Cells with Small Critical Charge", Idei et al., IEEE Transactions on Electron Devices, vol. 38, No. 11, Nov. 1991, pp. 2465-2471.

"An SOI 4 Transistors Self-Refresh Ultra-Low-Voltage Memory Cell", Thomas et al., IEEE, Mar. 2003, pp. 401-404.

"Design of a SOI Memory Cell", Stanojevic et al., IEEE Proc. 21st International Conference on Microelectronics (MIEL '97), vol. 1, NIS, Yugoslavis, Sep. 14-17, 1997, pp. 297-300.

"Effects of Floating Body on Double Polysilicon Partially Depleted SOI Nonvolatile Memory Cell", Chan et al., IEEE Electron Device Letters, vol. 24, No. 2, Feb. 2003, pp. 75-77.

"MOSFET Design Simplifies DRAM", P. Fazan, EE Times, May 14, 2002 (3 pages).

"One of Application of SOI Memory Cell—Memory Array", Lončer et al., IEEE Proc. 22nd Internat. Conf. on Microelectronics (MIEL 2000), vol. 2, NIS, Serbia, May 14-17, 2000, pp. 455-458.

"A SOI Current Memory for Analog Signal Processing at High Temperature", Portmann et al., 1999 IEEE International SOI Conference, Oct. 1999, pp. 18-19.

"Chip Level Reliability on SOI Embedded Memory", Kim et al., Proceedings 1998 IEEE International SOI Conference, Oct. 1998, pp. 135-139.

"Analysis of Floating-Body-Induced Leakage Current in 0.15µm SOI DRAM", Terauchi et al., Proceedings 1996 IEEE International SOI Conference, Oct. 1996, pp. 138-139.

"Programming and Erase with Floating-Body for High Density Low Voltage Flash EEPROM Fabricated on SOI Wafers", Chi et al., Proceedings 1995 IEEE International SOI Conference, Oct. 1995, pp. 129-130.

"Measurement of Transient Effects in SOI DRAM/SRAM Access Transistors", A. Wei, IEEE Electron Device Letters, vol. 17, No. 5, May 1996, pp. 193-195.

"In-Depth Analysis of Opposite Channel Based Charge Injection in SOI MOSFETs and Related Defect Creation and Annihilation", Sinha et al., Elsevier Science, Microelectronic Engineering 28, 1995, pp. 383-386.

"Dynamic Effects in SOI MOSFET's", Giffard et al., IEEE, 1991, pp. 160-161.

"A Simple 1-Transistor Capacitor-Less Memory Cell for High Performance Embedded DRAMs", Fazan et al., IEEE 2002 Custom Integrated Circuits Conference, Jun. 2002, pp. 99-102.

"A Novel Pattern Transfer Process for Bonded SOI Giga-bit DRAMs", Lee et al., Proceedings 1996 IEEE International SOI Conference, Oct. 1996, pp. 114-115.

"An Experimental 2-bit/Cell Storage DRAM for Macrocell or Memory-on-Logic Application", Furuyama et al., IEEE Journal of Solid-State Circuits, vol. 24, No. 2, Apr. 1989, pp. 388-393.

"High-Performance Embedded SOI DRAM Architecture for the Low-Power Supply", Yamauchi et al., IEEE Journal of Solid-State Circuits, vol. 35, No. 8, Aug. 2000, pp. 1169-1178.

"An SOI-DRAM with Wide Operating Voltage Range by CMOS/SIMOX Technology", Suma et al., 1994 IEEE International Solid-State Circuits Conference, pp. 138-139.

"A Capacitorless DRAM Cell on SOI Substrate", Wann et al., IEEE IEDM, 1993, pp. 635-638.

"The Multistable Charge Controlled Memory Effect in SOI Transistors at Low Temperatures", Tack et al., IEEE Workshop on Low Temperature Electronics, Aug. 7-8, 1989, University of Vermont, Burlington, pp. 137-141.

"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.

"Hot-Carrier Effects in Thin-Film Fully Depleted SOI MOSFET's", Ma et al., IEEE Electron Device Letters, vol. 15, No. 6, Jun. 1994, pp. 218-220.

"Design Analysis of Thin-Body Silicide Source/Drain Devices", 2001 IEEE International SOI Conference, Oct. 2001, pp. 21-22.

"SOI MOSFET on Low Cost SPIMOX Substrate", Iyer et al., IEEE IEDM, Sep. 1998, pp. 1001-1004.

"Simulation of Floating Body Effect in SOI Circuits Using BSIM3SOI", Tu et al., Proceedings of Technical Papers (IEEE Cat No. 97th8303), pp. 339-342.

"High-Field Transport of Inversion-Layer Electrons and Holes Including Velocity Overshoot", Assaderaghi et al., IEEE Transactions on Electron Devices, vol. 44, No. 4, Apr. 1997, pp. 664-671.

"Dynamic Threshold-Voltage MOSFET (DTMOS) for Ultra-Low Voltage VLSI", Assaderaghi et al., IEEE Transactions on Electron Devices, vol. 44, No. 3, Mar. 1997, pp. 414-422.

"Hot-Carrier-Induced Degradation in Ultra-Thin-Film-Depleted SOI MOSFETs", Yu et al., Solid-State Electronics, vol. 39, No. 12, 1996, pp. 1791-1794.

"Hot-Carrier Effect in Ultra-Thin-Film (UTF) Fully-Depleted SOI MOSFET's", Yu et al., 54th Annual Device Research Conference Digest (Cat. No. 96TH 8193), pp. 22-23.

"SOI MOSFET Design for All-Dimensional Scaling with Short Channel, Narrow Width and Ultra-thin Films", Chan et al., IEEE IEDM, 1995, pp. 631-634.

"A Novel Silicon-On-Insulator (SOI) MOSFET for Ultra Low Voltage Operation", Assaderaghi et al., 1994 IEEE Symposium on Low Power Electronics, pp. 58-59.

"Interface Characterization of Fully-Depleted SOI MOSFET by a Subthreshold I-V Method", Yu et al., Proceedings 1994 IEEE International SOI Conference, Oct. 1994, pp. 63-64.

"A Capacitorless Double-Gate DRAM Cell Design for High Density Applications", Kuo et al., IEEE IEDM, Feb. 2002, pp. 843-846.

"A Dynamic Threshold Voltage MOSFET (DTMOS) for Ultra-Low Voltage Operation", Assaderaghi et al., IEEE IEDM, 1994, pp. 809-812.

"A Dynamic Threshold Voltage MOSFET (DTMOS) for Very Low Voltage Operation", Assaderaghi et al., IEEE Electron Device Letters, vol. 15, No. 12, Dec. 1994, pp. 510-512.

"A Capacitorless DRAM Cell on SOI Substrate", Wann et al., IEEE IEDM 1993, pp. 635-638.

"Studying the Impact of Gate Tunneling on Dynamic Behaviors of Partially-Depleted SOI CMOS Using BSIMPD", Su et al., IEEE Proceedings of the International Symposium on Quality Electronic Design (ISQED '02), Apr. 2002 (5 pages).

"Characterization of Front and Back Si-SiO$_2$ Interfaces in Thick- and Thin-Film Silicon-on-Insulator MOS Structures by the Charge-Pumping Technique", Wouters et al., IEEE Transactions on Electron Devices, vol. 36, No. 9, Sep. 1989, pp. 1746-1750.

"An Analytical Model for the Misis Structure in SOI MOS Devices", Tack et al., Solid-State Electronics vol. 33, No. 3, 1990, pp. 357-364.

"A Long Data Retention SOI DRAM with the Body Refresh Function", Tomishima et al., IEICE Trans. Electron., vol. E80-C, No. 7, Jul. 1997, pp. 899-904.

"A Simple 1-Transistor Capacitor-Less Memory Cell for High Performace Embedded DRAMs", Fazan et al., IEEE 2002 Custom Integrated Circuits Conference, Jun. 2002, pp. 99-102.

"Capacitor-Less 1-Transistor DRAM", Fazan et al., 2002 IEEE International SOI Conf., Oct. 2002, pp. 10-13.

"SOI (Silicon-on-Insulator) for High Speed Ultra Large Scale Integration", C. Hu, Jpn. J. Appl. Phys. vol. 33 (1994) pp. 365-359, Part 1, No. 1B, Jan. 1994.

"Source-Bias Dependent Charge Accumulation in P+-Poly Gate SOI Dynamic Random Access Memory Cell Transistors", Sim et al., Jpn. J. Appl. Phys. vol. 37 (1998) pp. 1260-1263, Part 1, No. 3B, Mar. 1998.

"Suppression of Parasitic Bipolar Action in Ultra-Thin-Film Fully-Depleted CMOS/SIMOX Devices by Ar-Ion Implantation into Source/Drain Regions", Ohno et al., IEEE Transactions on Electron Devices, vol. 45, No. 5, May 1998, pp. 1071-1076.

dRAM Design Using the Taper-Isolated Dynamic RAM Cell, Leiss et al., IEEE Transactions on Electron Devices, vol. ED-29, No. 4, Apr. 1982, pp. 707-714.

"Fully Isolated Lateral Bipolar-MOS Transistors Fabricated in Zone-Melting-Recrystallized Si Films on SiO2", Tsaur et al., IEEE Electron Device Letters, vol. EDL-4, No. 8, Aug. 1983, pp. 269-271.

"Silicon-On-Insulator Bipolar Transistors", Rodder et al., IEEE Electron Device Letters, vol. EDL-4, No. 6, Jun. 1983, pp. 193-195.

"Characteristics and Three-Dimensional Integration of MOSFET's In Small-Grain LPCVD Polycrystalline Silicon", Malhi et al., IEEE Transactions on Electron Devices, vol. ED-32, No. 2, Feb. 1985, pp. 258-281.

"Triple-Wel nMOSFET Evaluated as a Capacitor-Less DRAM Cell for Nanoscale Low-Cost & High Density Applications", Villaret et al., Handout at Proceedings of 2003 Silicon Nanoelectronics Workshop, Jun. 8-9, 2003, Kyoto, Japan (2 pages).

"Mechanisms of Charge Modulation in the Floating Body of Triple-Well NMOSFET Capacitor-less DRAMs", Villaret et al., Handout at Proceedings of INFOS 2003, Jun. 18-20, 2003, Barcelona, Spain (2 pages).

"Embedded DRAM Process Technology", M. Yamawaki, Proceedings of the Symposium on Semiconductors and Integrated Circuits Technology, 1998, vol. 55, pp. 38-43.

"3-Dimensional Simulation of Turn-off Current in Partially Depleted SOI MOSFETs", Ikeda et al., IEIC Technical Report, Institute of Electronics, Information and Communication Engineers, 1998, vol. 97, No. 557 (SDM97 186-198), pp. 27-34.

"Dynamic floating body control SOI CMOS for power managed multimedia ULSIs", F. Morishita et al., Proc. CICC, pp. 263-266, 1997.

"A 312-MHz 16-Mb Random-Cycle Embedded DRAM Macro With a Power-Down Data Retention Mode for Mobile Applications", F. Morishita et al., J. Solid-State Circuits, vol. 40, No. 1, pp. 204-212. 2005.

"Leakage Mechanism due to Floating Body and Countermeasure on Dynamic Retention Mode of SOI-DRAM", F. Morishita et al., Symposium on VLSI Technology Digest of Technical Papers, pp. 141-142, 1995.

"Scalability Study on a Capacitorless 1T-DRAM: From Single-gate PD-SOI to Double-gate FINDRAM", Tenaka et al., 2004 IEEE, 4 pages.

"A Design of a Capactorless 1-T-DRAM Cell Using Gate-Induced Drain Leakage (GIDL) Current for Low-Power and High-speed Embedded Memory", Yoshida et al., 2003 IEEE, 4 pages.

"A Study of High Scalable DG-FinDRAM", Yoshida et al., IEEE Electron Device Letters, vol. 26, No. 9, Sep. 2005, pp. 655-657.

"Novel Capacitorless 1T-DRAM From Single-gate PD-SOI to Double-gate FinDRAM", ATIP Scoops, May 9, 2005, 9 pages.

"A High-Speed Clamped Bit-Line Current-Mode Sense Amplifier", T. Blalock, IEEE Journal of Solid-State Circuits, vol. 26, No. 4, Apr. 1991, pp. 542-548.

"Low-Voltage Transient Bipolar Effect Induced by Dynamic Floating-Body Charging in PD/SOI MOSFETs", Pelella et al., SOI Conference, 1995, 2 pages.

"Floating-Body Concerns for SOI Dynamic Random Access Memory (DRAM)", Mendelman et al, Proceedings 1996 IEEE International SOI Conference, Oct. 1996, pp. 136-137.

"An SOI voltage-controlled bipolar-MOS device", J.P. Colinge, IEEE Transactions on Electron Devices, vol. ED-34, No. 4, Apr. 1987, pp. 845-849.

* cited by examiner

BIPOLAR READING TECHNIQUE FOR A MEMORY CELL HAVING AN ELECTRICALLY FLOATING BODY TRANSISTOR

RELATED APPLICATIONS

This application is a divisional application of application Ser. No. 11/304,387 (now U.S. Pat. No. 7,301,803), filed Dec. 15, 2005. These non-provisional applications claim priority to U.S. Provisional Application Ser. No. 60/638,663, entitled "Bipolar Reading Technique for a Memory Cell Having an Electrically Floating Body Transistor", filed Dec. 22, 2004. The contents of this provisional application are incorporated by reference herein in their entirety.

BACKGROUND

This invention relates to a semiconductor memory cell, array, architecture and device, and techniques for controlling and/or operating such cell and device; and more particularly, in one aspect, to a semiconductor dynamic random access memory ("DRAM") cell, array, architecture and/or device wherein the memory cell includes an electrically floating body in which an electrical charge is stored.

There is a continuing trend to employ and/or fabricate advanced integrated circuits using techniques, materials and devices that improve performance, reduce leakage current and enhance overall scaling. Silicon-on-Insulator (SOI) is a material in which such devices may be fabricated on or in (hereinafter collectively "on"). Such devices are known as SOI devices and include, for example, partially depleted (PD), fully depleted (FD) devices, multiple gate devices (for example, double or triple gate), and Fin-FET. SOI devices have demonstrated improved performance (for example, speed), reduced leakage current characteristics and considerable enhancement in scaling.

One type of dynamic random access memory cell is based on, among other things, a floating body effect of SOI transistors. (See, for example, U.S. patent application Ser. No. 10/450,238, Fazan et al., filed Jun. 10, 2003 and entitled "Semiconductor Device", hereinafter "Semiconductor Memory Device Patent Application"). In this regard, the memory cell may consist of a PD or a FD SOI transistor (or transistor formed in bulk material/substrate) on having a channel, which is disposed adjacent to the body and separated therefrom by a gate dielectric. The body region of the transistor is electrically floating in view of the insulation or non-conductive region (for example, in bulk-type material/substrate) disposed beneath the body region. The state of memory cell is determined by the concentration of charge within the body region of the SOI transistor.

With reference to FIGS. 1A, 1B and 1C, in one embodiment, semiconductor DRAM array 10 includes a plurality of memory cells 12 each consisting of transistor 14 having gate 16, body region 18, which is electrically floating, source region 20 and drain region 22. The body region 18 is disposed between source region 20 and drain region 22. Moreover, body region 18 is disposed on or above region 24, which may be an insulation region (for example, in SOI material/substrate) or non-conductive region (for example, in bulk-type material/substrate). The insulation or non-conductive region may be disposed on substrate 26.

Data is written into or read from a selected memory cell by applying suitable control signals to a selected word line(s) 28, a selected source line(s) 30 and/or a selected bit line(s) 32. In response, charge carriers are accumulated in or emitted and/or ejected from electrically floating body region 18 wherein the data states are defined by the amount of carriers within electrically floating body region 18. Notably, the entire contents of the Semiconductor Memory Device Patent Application, including, for example, the features, attributes, architectures, configurations, materials, techniques and advantages described and illustrated therein, are incorporated by reference herein.

As mentioned above, memory cell 12 of DRAM array 10 operates by accumulating in or emitting/ejecting majority carriers (electrons or holes) 34 from body region 18 of, for example, N-channel transistors. (See, FIGS. 2A and 2B). In this regard, accumulating majority carriers (in this example, "holes") 34 in body region 18 of memory cells 12 via, for example, impact ionization near source region 20 and/or drain region 22, is representative of a logic high or "1" data state. (See, FIG. 2A). Emitting or ejecting majority carriers 30 from body region 18 via, for example, forward biasing the source/body junction and/or the drain/body junction, is representative of a logic low or "0" data state. (See, FIG. 2B).

Notably, for at least the purposes of this discussion, a logic high or State "1" corresponds to an increased concentration of majority carries in the body region relative to an unprogrammed device and/or a device that is programmed with a logic low or State "0". In contrast, a logic low or State "0" corresponds to a reduced concentration of majority carries in the body region relative to an unprogrammed device and/or a device that is programmed with a logic high or State "1".

Conventional reading is performed by applying a small drain bias and a gate bias above the transistor threshold voltage. The sensed drain current is determined by the charge stored in the floating body giving a possibility to distinguish between the states "1" and "0". Permanent scaling down of device size leads to increase of variations of the device characteristics. It is widely recognized that these variations (mismatch) is key to precision IC design. Due to mismatch, designers are forced to include substantial design margin or risk yield loss, both of which cost money and time.

A floating body memory device has two different current states corresponding to two different logical states: "1" and "0". Reading is performed by comparison of a cell current with the current from a reference cell that is usually placed between the state "1" and state "0". Large enough statistical variations in the device currents may cause an erroneous reading as it is shown in FIG. 3.

Small programming window reduces the speed or access time of the memory device, memory array, and/or memory cells. As such, there is a need for high performance reading techniques for floating body memory cells, devices and arrays providing better reading speed and robustness to technology fluctuations.

SUMMARY OF THE INVENTIONS

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

In one aspect, the present inventions are directed to an integrated circuit device comprising a memory cell including an electrically floating body transistor, wherein the electrically floating body transistor includes a source region, a drain region, an electrically floating body region disposed between the source region and the drain region, and a gate disposed over the body region. Each memory cell includes at least (i) a first data state which is representative of a first charge in the body region of the transistor, and (ii) a second data state which is representative of a second charge in the body region of the transistor. The integrated circuit device further comprises data sensing circuitry, coupled to the memory cell, to sense the data state of the memory cell, wherein, in response to read control signals applied to the electrically floating body transistor, the electrically floating body transistor generates a bipolar transistor current which is representative of the data state of the memory cell and wherein the data sensing circuitry determines the data state of the memory cell substantially based on the bipolar transistor current.

The electrically floating body transistor may be an N-channel type transistor or a P-channel type transistor.

The read control signals may include signals applied to the gate, source region, and drain region to cause, force and/or induce the bipolar transistor current which is representative of the data state of the memory cell. In one embodiment, the read control signals include a positive voltage pulse which is applied to the drain region of the electrically floating body transistor. In another embodiment, the read control signals include a negative voltage pulse which is applied to the drain region of the electrically floating body transistor.

In another principal, an integrated circuit device comprising a memory cell including an electrically floating body transistor which consists essentially of a source region and drain, each having impurities to provide a first conductivity type, a body region disposed between the source region and the drain region wherein the body region is electrically floating and includes impurities to provide a second conductivity type wherein the second conductivity type is different from the first conductivity type, and a gate disposed over the body region. Each memory cell includes at least (i) a first data state which is representative of a first charge in the body region of the transistor, and (ii) a second data state which is representative of a second charge in the body region of the transistor.

The integrated circuit device further comprises (i) data sensing circuitry, coupled to the memory cell, to sense the data state of the memory cell, and (ii) control circuitry, coupled to the memory cell, to generate and apply read control signals to the electrically floating body transistor. In response to read control signals applied to the electrically floating body transistor, the electrically floating body transistor generates a bipolar transistor current which is representative of the data state of the memory cell and wherein the data sensing circuitry determines the data state of the memory cell substantially based on the bipolar transistor current.

The electrically floating body transistor of this aspect of the invention may be an N-channel type transistor or a P-channel type transistor.

The read control signals may include signals applied to the gate, source region, and drain region to cause, force and/or induce the bipolar transistor current which is representative of the data state of the memory cell. In one embodiment, the read control signals include a positive voltage pulse which is applied to the drain region of the electrically floating body transistor. In another embodiment, the read control signals include a negative voltage pulse which is applied to the drain region of the electrically floating body transistor.

In another principal, an integrated circuit device comprising a memory cell including an electrically floating body transistor, wherein the electrically floating body transistor is disposed in or on a semiconductor region or layer which resides on or above an insulating region or layer of a substrate.

The electrically floating body transistor includes a source region and drain, each having impurities to provide a first conductivity type, a body region disposed between the source region and the drain region wherein the body region is electrically floating and includes impurities to provide a second conductivity type wherein the second conductivity type is different from the first conductivity type, and a gate disposed over the body region. Each memory cell includes at least (i) a first data state which is representative of a first charge in the body region of the transistor, and (ii) a second data state which is representative of a second charge in the body region of the transistor.

The integrated circuit device further comprises (i) data sensing circuitry, coupled to the memory cell, to sense the data state of the memory cell, and (ii) control circuitry, coupled to the memory cell, to generate and apply read control signals to the electrically floating body transistor. In response to read control signals applied to the electrically floating body transistor, the electrically floating body transistor generates a bipolar transistor current which is representative of the data state of the memory cell and wherein the data sensing circuitry determines the data state of the memory cell substantially based on the bipolar transistor current.

The electrically floating body transistor of this aspect of the invention may be an N-channel type transistor or a P-channel type transistor.

The read control signals may include signals applied to the gate, source region, and drain region to cause, force and/or induce the bipolar transistor current which is representative of the data state of the memory cell. In one embodiment, the read control signals include a positive voltage pulse which is applied to the drain region of the electrically floating body transistor. In another embodiment, the read control signals include a negative voltage pulse which is applied to the drain region of the electrically floating body transistor.

Again, there are many inventions, and aspects of the inventions, described and illustrated herein. This Summary of the Inventions is not exhaustive of the scope of the present inventions. Moreover, this Summary of the Inventions is not intended to be limiting of the inventions and should not be interpreted in that manner. While certain embodiments have been described and/or outlined in this Summary of the Inventions, it should be understood that the present inventions are not limited to such embodiments, description and/or outline, nor are the claims limited in such a manner. Indeed, many others embodiments, which may be different from and/or similar to, the embodiments presented in this Summary, will be apparent from the description, illustrations and claims, which follow. In addition, although various features, attributes and advantages have been described in this Summary of the Inventions and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

DETAILED DESCRIPTION

At the outset, it should be noted that there are many inventions described herein as well as many aspects and embodiments of those inventions.

In a first aspect, the present inventions are directed to a memory cell, having an electrically floating body transistor, and/or a technique of reading the data state in such a memory cell. In this regard, the present inventions employ the intrinsic bipolar transistor current to read and/or determine the data state of the electrically floating body memory cell (for example, whether the electrically floating body memory cell is programmed in a State "0" and State "1"). Here, during the read operation, the data state is determined primarily by, sensed substantially using and/or based substantially on the bipolar transistor current that is responsive to the read control signals and significantly less by the interface channel current component, which is negligible relatively to the bipolar component.

Notably, the bipolar transistor current may be very sensitive to the floating body potential due to the high gain of the intrinsic bipolar transistor. As such, the programming window obtainable with the bipolar reading technique may be considerably higher (for example, up two orders of magnitude higher) than the programming window employing a conventional reading technique (which is based primarily on the interface channel current component. The large programming window provides other opportunities/advantages, for example, simulations demonstrate that the bipolar reading may be accomplished significantly faster than conventional techniques (for example, in less than in 1 ns).

Figure 1A:
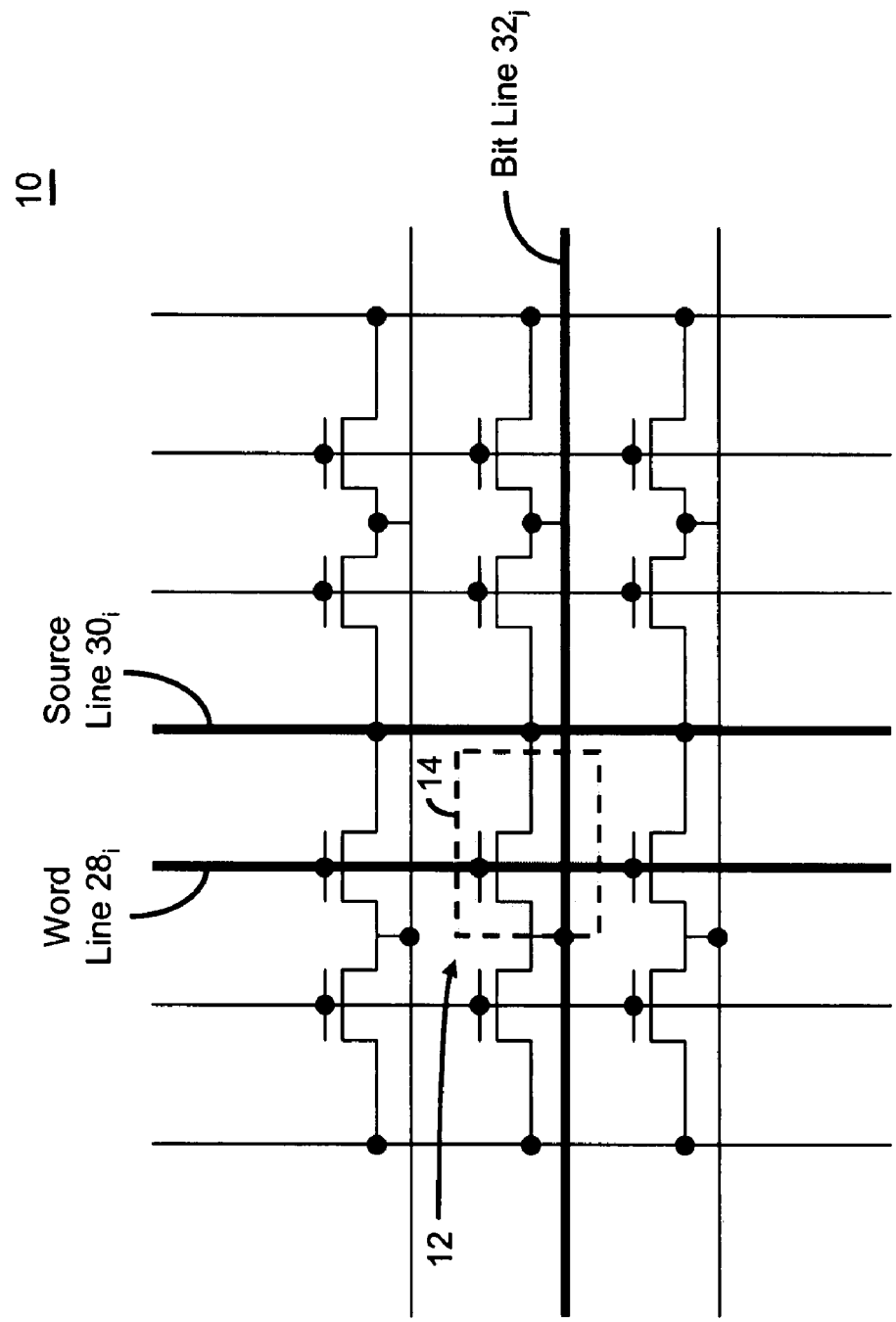
FIG. 1A is a schematic representation of a prior art semiconductor DRAM array including a plurality of memory cells comprised of one electrically floating body transistor.
Figure 1B:
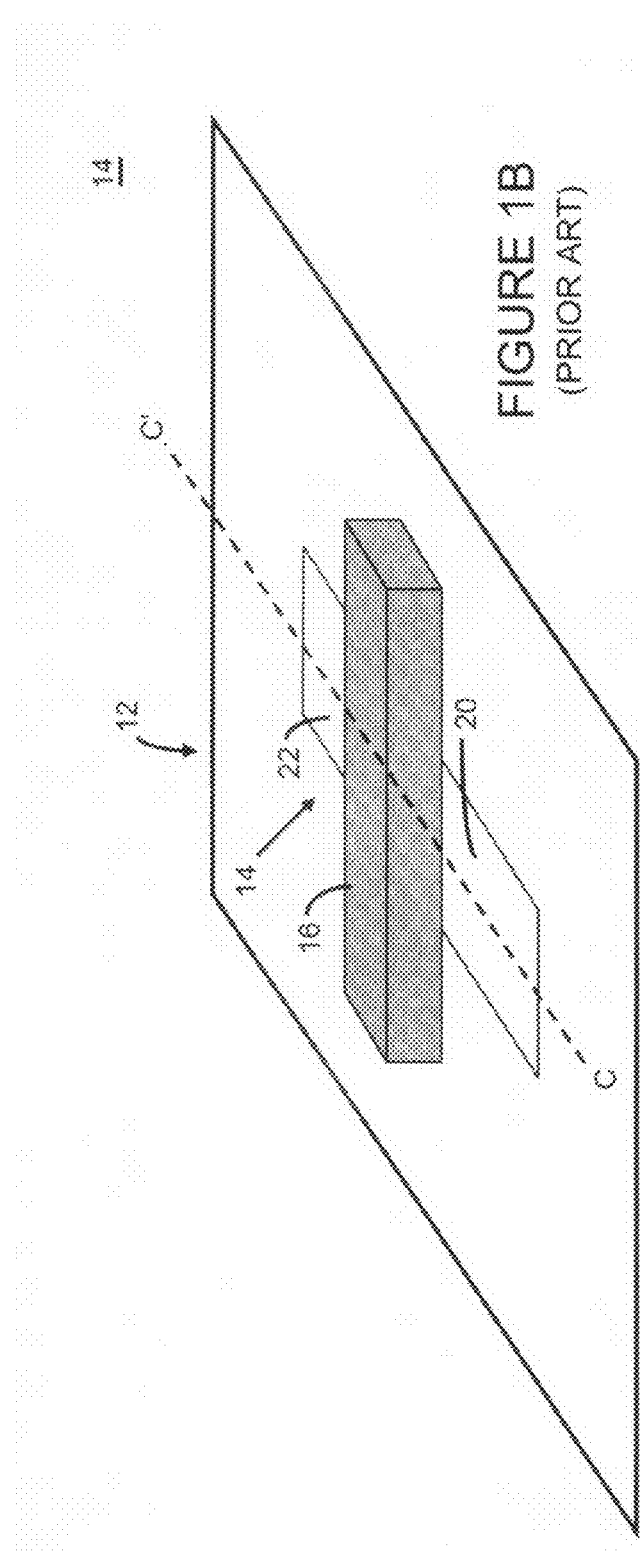
FIG. 1B is a three dimensional view of an exemplary prior art memory cell comprised of one electrically floating body transistor (PD-SOI NMOS)
Figure 1C:
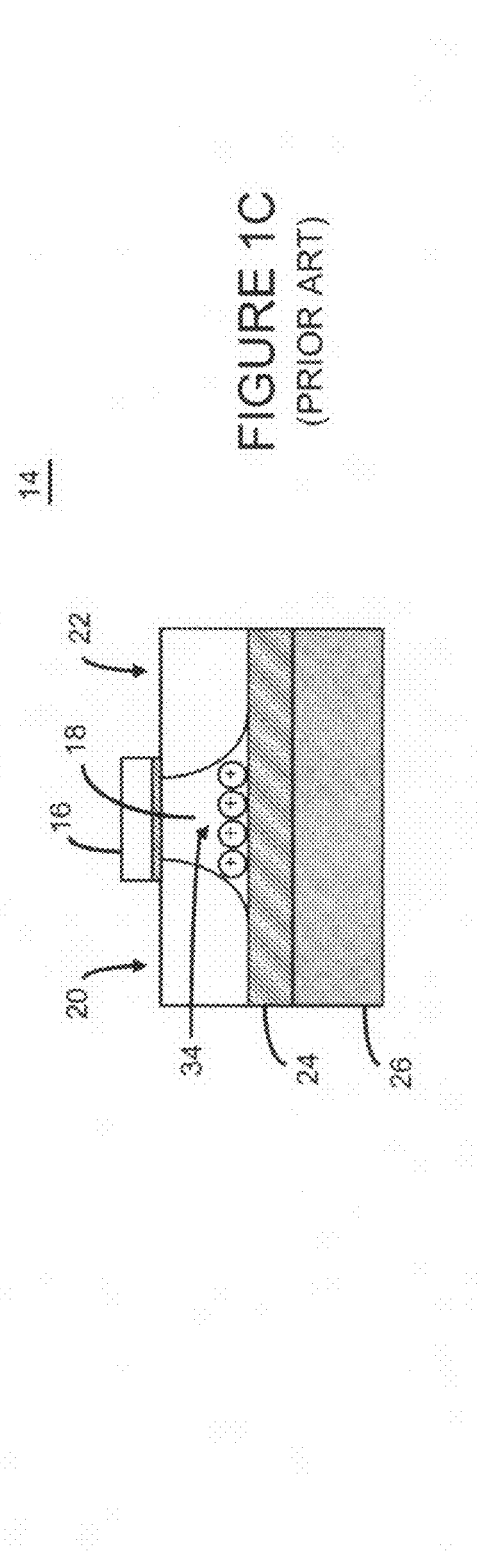
FIG. 1C is a cross-sectional view of the prior art memory cell of FIG. 1B, cross-sectioned along line C-C'.
Figure 2A:
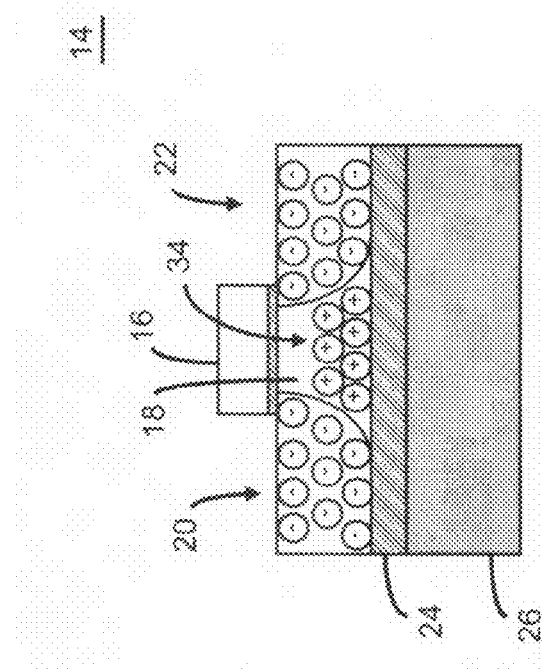
FIGS. 2A and 2B are exemplary schematic illustrations of the charge relationship, for a given data state, of the floating body, source and drain regions of a prior art memory cell comprised of one electrically floating body transistor (PD-SOI NMOS)
Figure 2B:
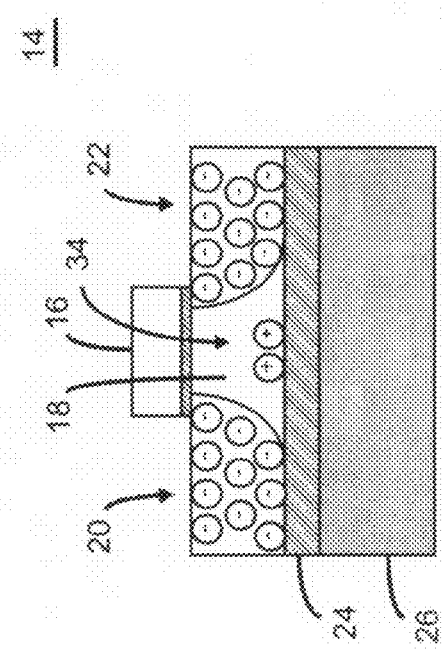
Figure 3:
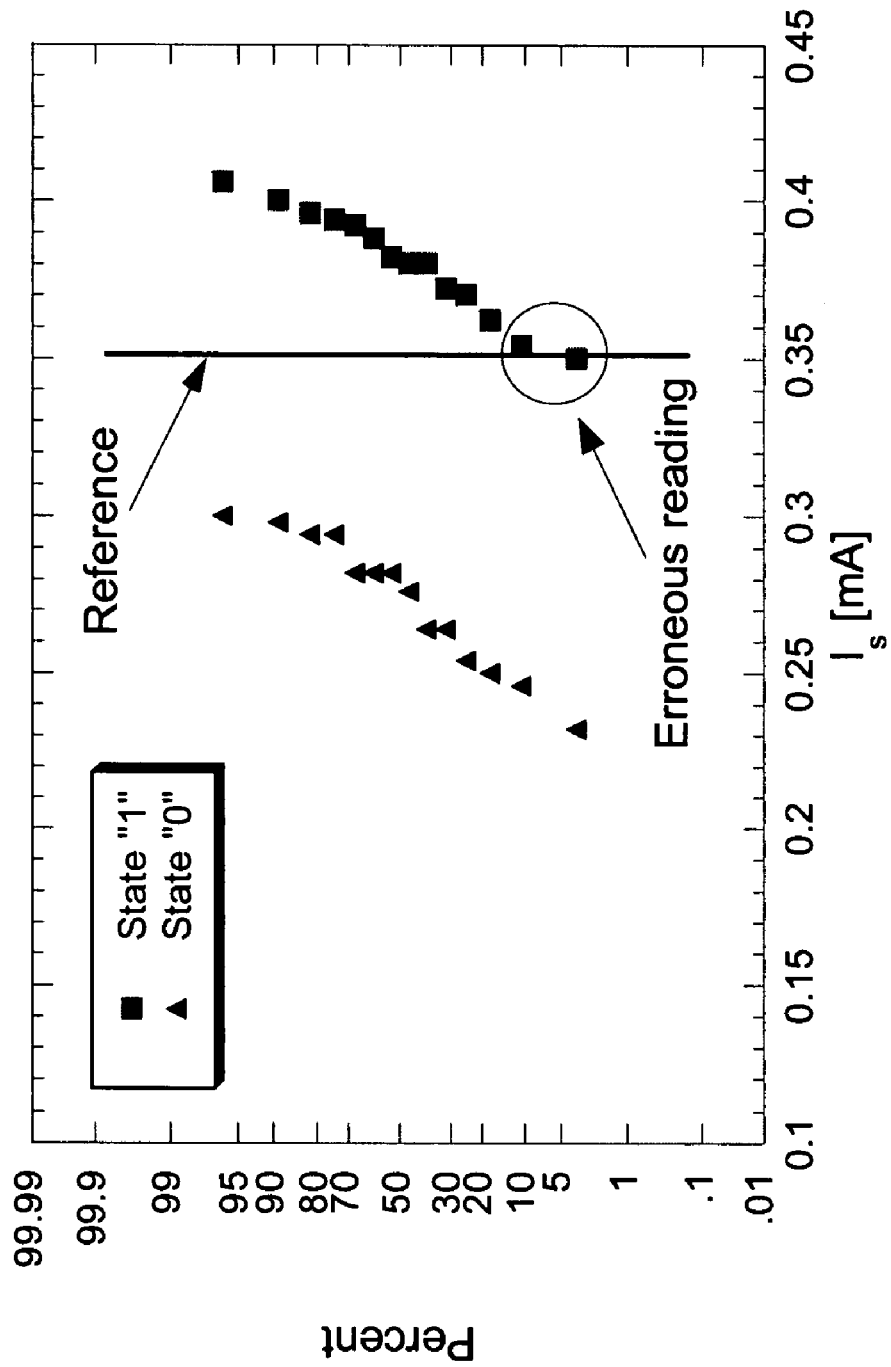
FIG. 3 illustrates statistical variations in the currents read from an electrically floating body transistor.
Figure 4A:
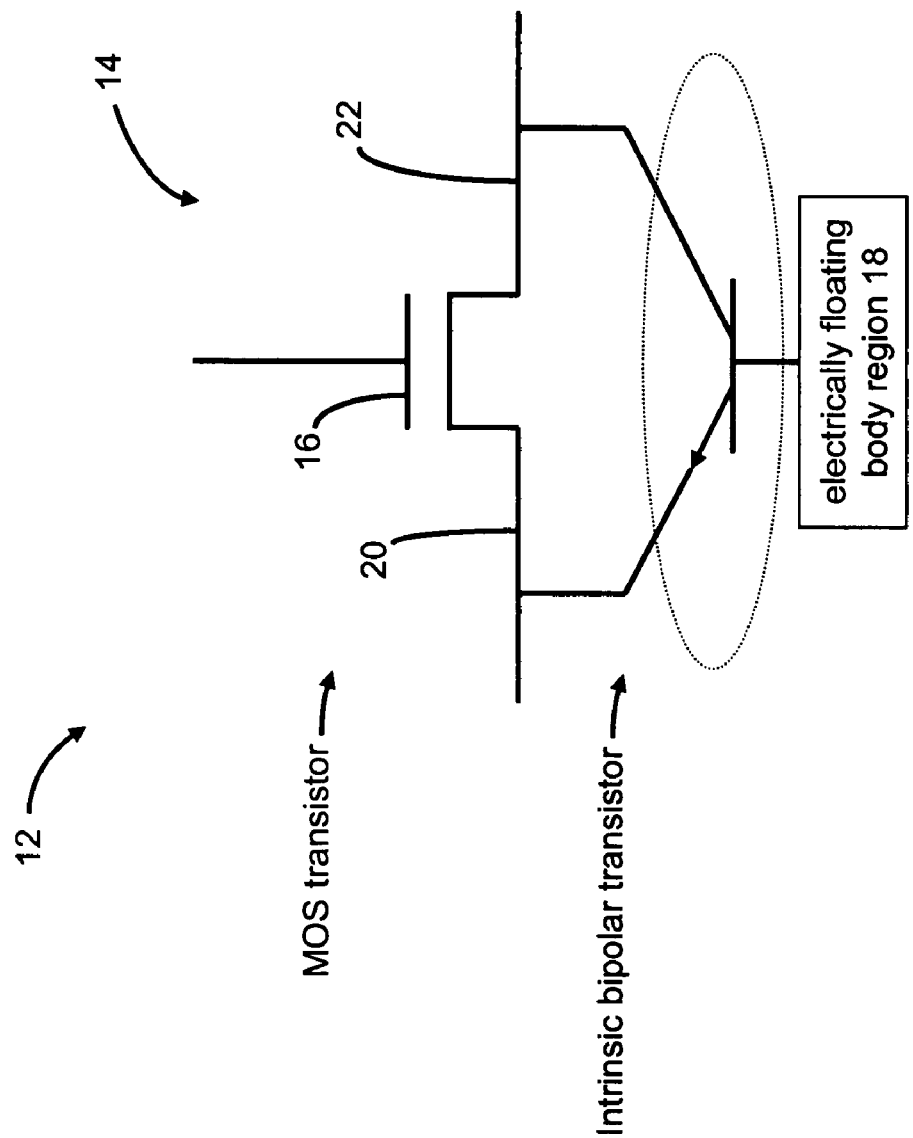
FIG. 4A is a schematic representation of an equivalent electrically floating body memory cell (N-channel type) including an intrinsic bipolar transistor in addition to the MOS transistor.

With reference to FIG. 4A, in one embodiment, the present invention includes memory cell 12 having electrically floating body transistor 14. In this exemplary embodiment, electrically floating body transistor 14 is an N-channel type transistor; as such, majority carriers are "holes". The N-channel type transistor 14 equivalently includes an electrically floating body MOS transistor and an intrinsic bipolar transistor. In this regard, a N-type MOSFET includes an $N^+$ source, the P-type body and the $N^+$ drain wherein the $N^+$ source, the P-type body and the $N^+$ drain intrinsically form the emitter, the base, and the collector, respectively of an NPN bipolar transistor.

Figure 4B:
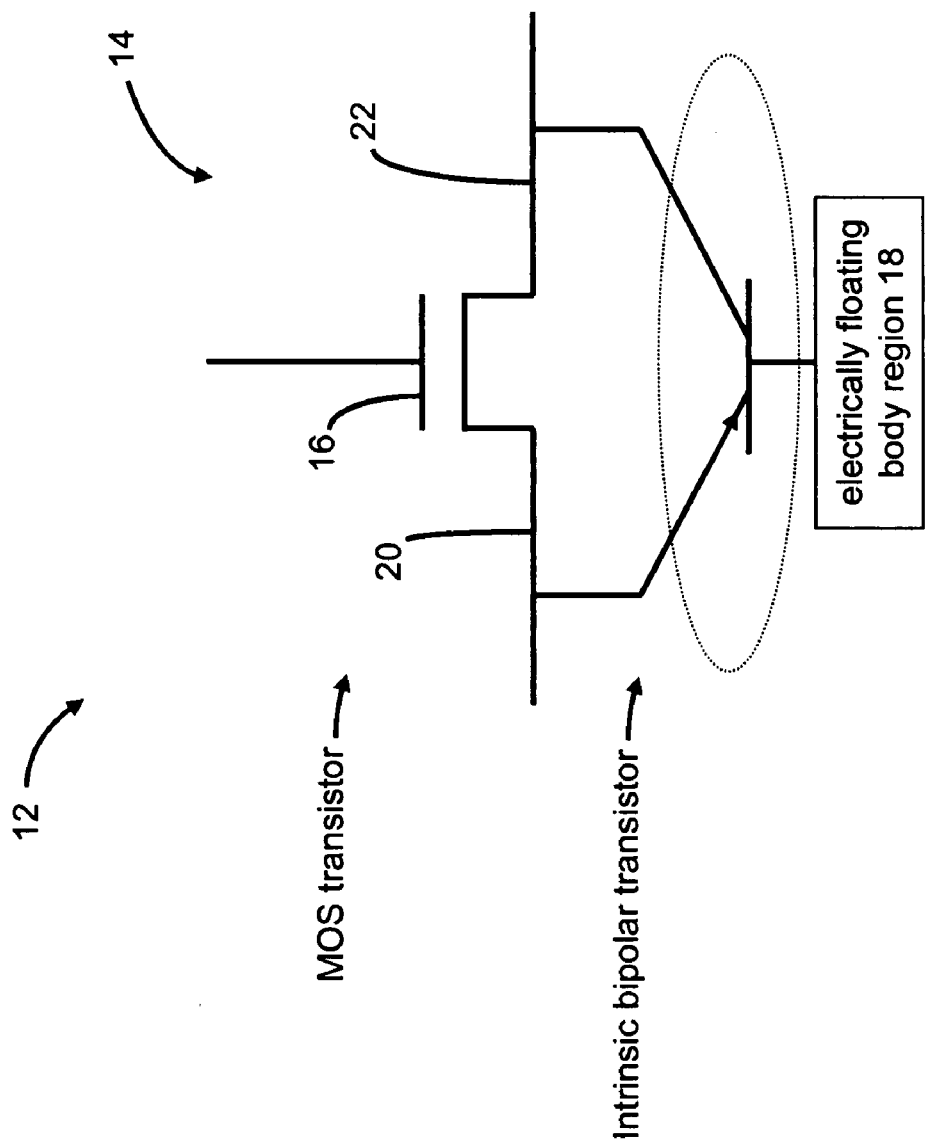
FIG. 4B is a schematic representation of an equivalent electrically floating body memory cell (P-channel type) including an intrinsic bipolar transistor in addition to the MOS transistor.

Notably, with reference to FIG. 4B, the present inventions are fully applicable to a memory cell comprising a P-channel type electrically floating body transistor (here, the majority carriers are "electrons"). The P-channel type transistor also equivalently includes an electrically floating body MOS transistor and an intrinsic bipolar transistor. In this regard, a P-type MOSFET includes an $P^+$ source, the N-type body and the $P^+$ drain wherein the $P^+$ source, the N-type body and the $P^+$ drain intrinsically form the emitter, the base, and the collector, respectively of an PNP bipolar transistor.

In operation, during the read operation, suitable and predetermined control signals may be applied to gate 16, source region 20, and drain region 22 in order to cause, force and/or induce the bipolar transistor current in transistor 14 of memory cell 12. For example, in one embodiment, 0 volts may be applied to source region 20 and gate 16 and a positive voltage (for example, +3.5 volts) may be applied to drain region 22. Such control signals, in combination, induce and/or cause a bipolar transistor current which is considerably larger than any channel current. As such, sensing circuitry (for example, a cross-coupled sense amplifier), which is coupled to transistor 14 (for example, drain region 22) of memory cell 12, senses the data state using primarily and/or based substantially on the bipolar transistor current.

Thus, in response to read control signals, electrically floating body transistor 14 generates a bipolar transistor current which is representative of the data state of memory cell 12. Where the data state is a logic high or State "1", electrically floating body transistor 14 provides a substantially greater bipolar transistor current than where the data state is a logic low or State "0". Indeed, electrically floating body transistor 14 may provide little to no bipolar transistor current when the data state is a logic low or State "0". As discussed in more detail below, data sensing circuitry determines the data state of the memory cell substantially based on the bipolar transistor current.

Where electrically floating body transistor 14 is an P-channel type transistor, in operation, during the read operation, in one embodiment, 0 volts may be applied to source region 20 and gate 16 and a negative voltage (for example, −4 volts) may be applied to drain region 22. Such control signals, in combination, induce and/or cause a bipolar transistor current which is considerably larger than any channel current. Moreover, electrically floating body transistor 14 generates a bipolar transistor current which is representative of the data state of the memory cell. In this embodiment, where the data state is logic high or State "1", electrically floating body transistor 14 provides a substantially greater bipolar transistor current than where the data state is a logic low or State "0". Indeed, electrically floating body transistor 14 may provide little to no bipolar transistor current when the data state is a logic low or State "0". The sensing circuitry (for example, a cross-coupled sense amplifier), which is coupled to transistor 14 (for example, drain region 22) of memory cell 12, senses the data state using primarily and/or based substantially on the bipolar transistor current.

Notably, the exemplary voltage amplitudes to implement the read operation are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.25, 0.5, 1.0 and 2.0 volts) whether one or more of the voltages (for example, the source, drain or gate voltages) become or are positive and negative.

Figure 5A:
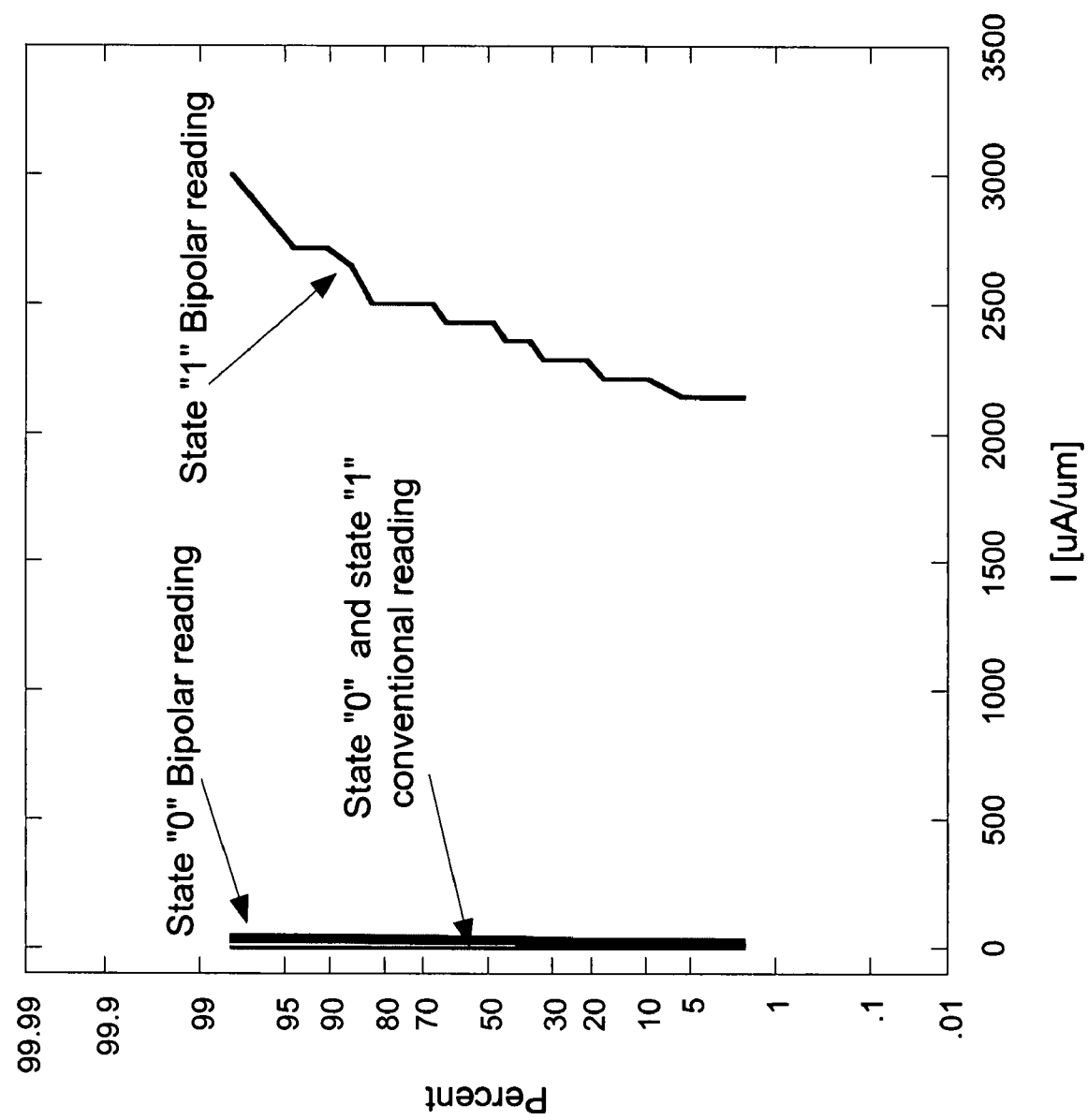
FIGS. 5A and 5B illustrate the statistical distributions for conventional reading technique versus bipolar reading.
Figure 5B:
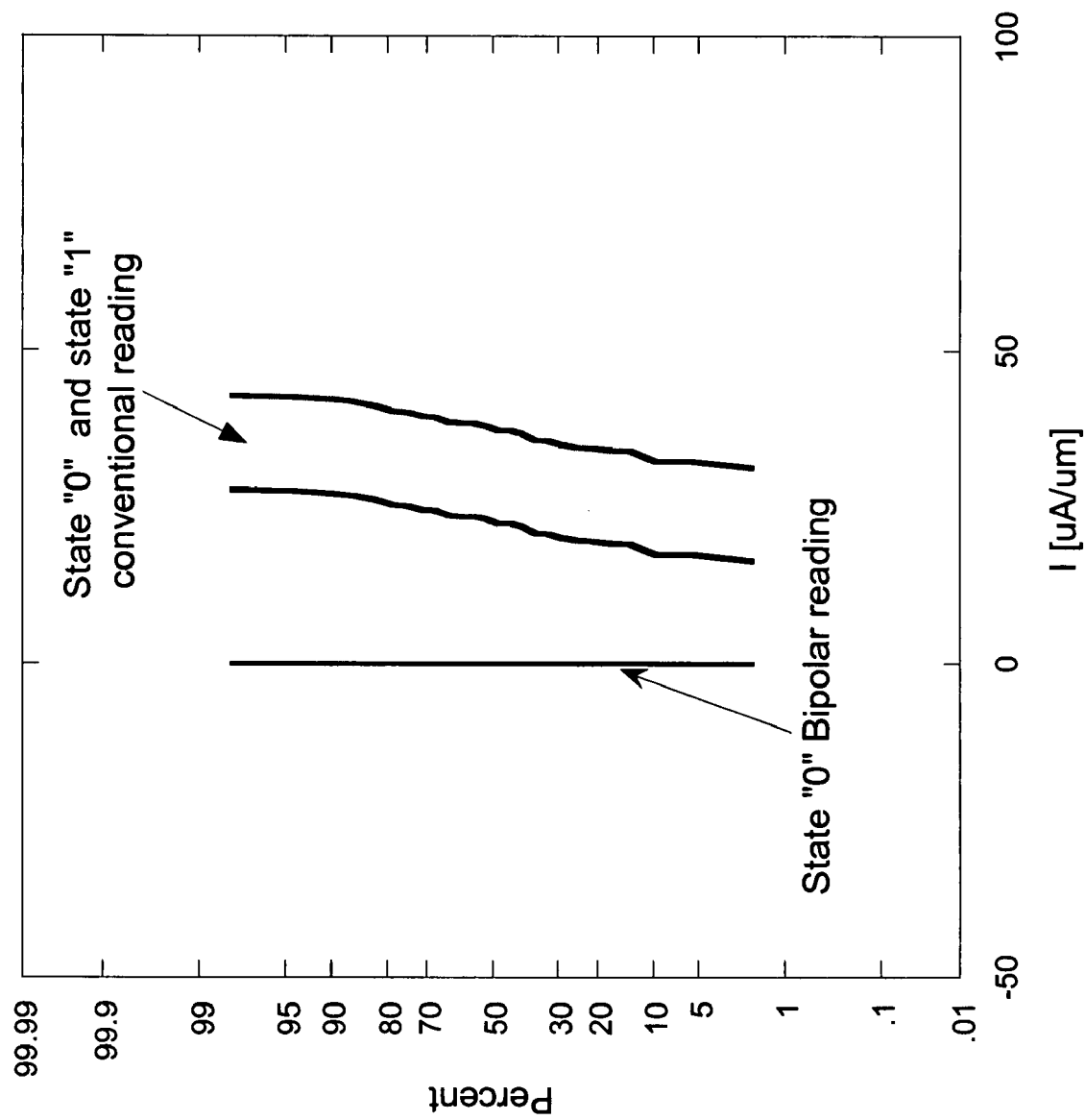
Figure 6:
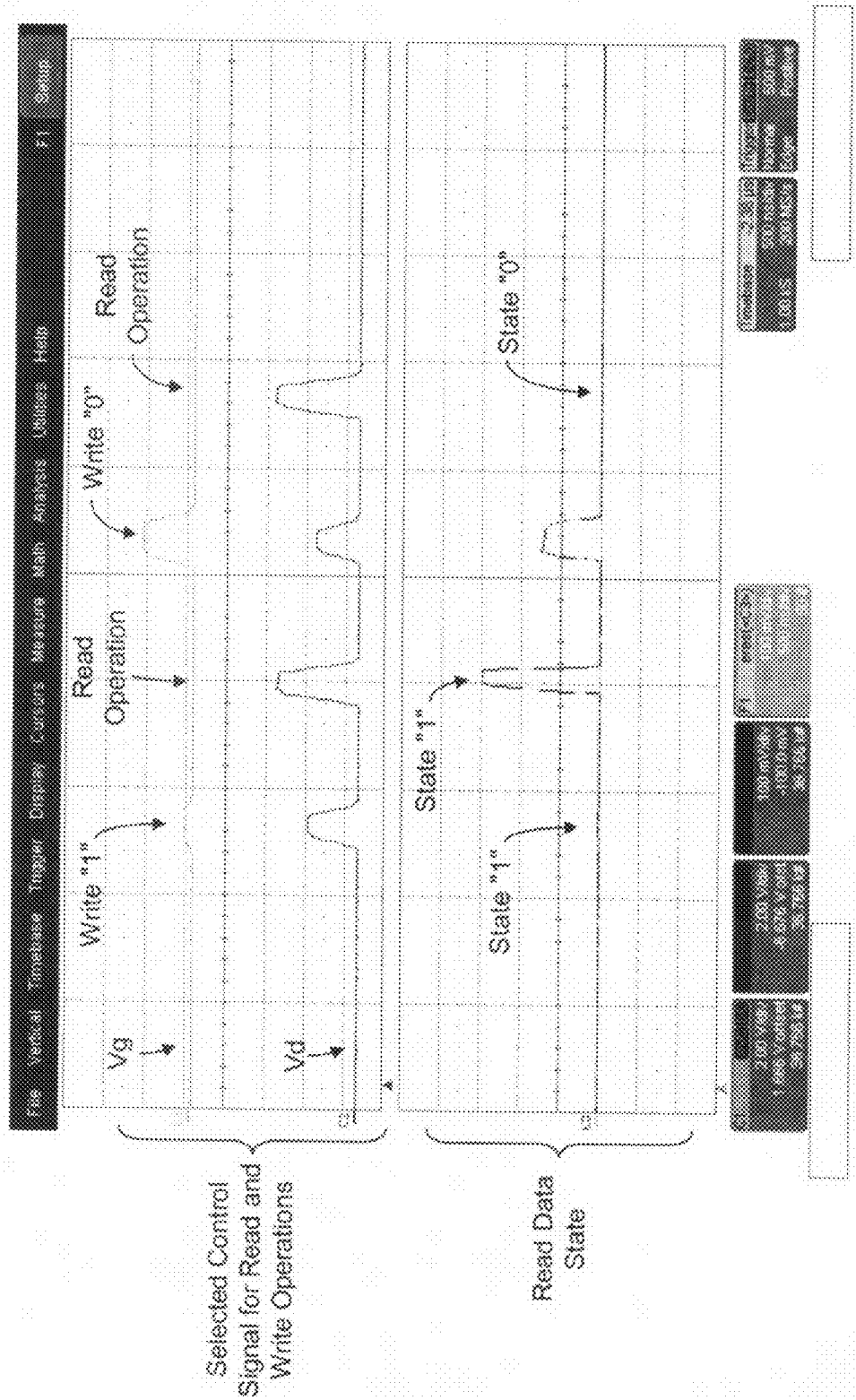
FIG. 6 is an exemplary graphical illustration of selected control signals for writing State "1" and State "0" into a memory cell (having an electrically floating body transistor) wherein the memory cell state is read in accordance with the technique of the present invention.

With reference to FIGS. 5A and 5B, by employing the bipolar current reading technique described herein, the operating and/or response characteristic(s) of memory cells 12 and the distributions of State "1" and State "0" are more uniform. This may provide higher confidence and greater reliability in correctly reading the data stored in memory cell 12. FIG. 6 is an exemplary graphical illustration of selected control signals, having exemplary values/characteristics, for reading State "1" and State "0" in memory cell 12 of FIG. 4A. Although portions of this description include details directed to N-channel transistors, the inventions (and embodiments thereof) described herein are entirely applicable to P-channel transistors, as mentioned above.

In another aspect, the present inventions may be implemented an integrated circuit device (for example, a discrete memory device or a device having embedded memory) having a memory array including a plurality of memory cells each including an electrically floating body transistor. The memory arrays may be comprised of N-channel, P-channel and/or both types of transistors. Indeed, circuitry that is peripheral to the memory array (for example, data sense circuitry (for example, sense amplifiers or comparators), memory cell selection and control circuitry (for example, word line and/or source line drivers), as well as row and column address decoders) may include P-channel and/or N-channel type transistors.

Figure 7A:
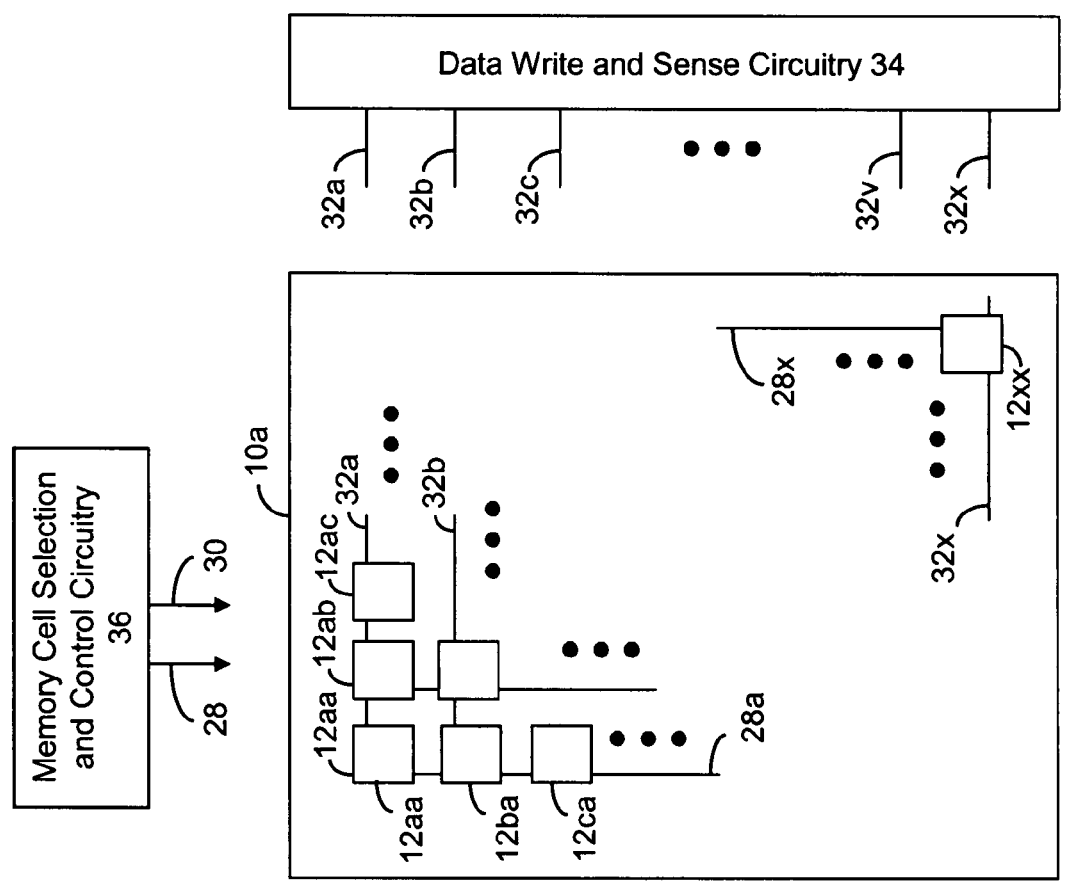
FIGS. 7A and 7B are schematic block diagrams of embodiments of an integrated circuit device including, among other things, a memory cell array, data sense and write circuitry, memory cell selection and control circuitry, according certain aspects of the present inventions.
Figure 7B:
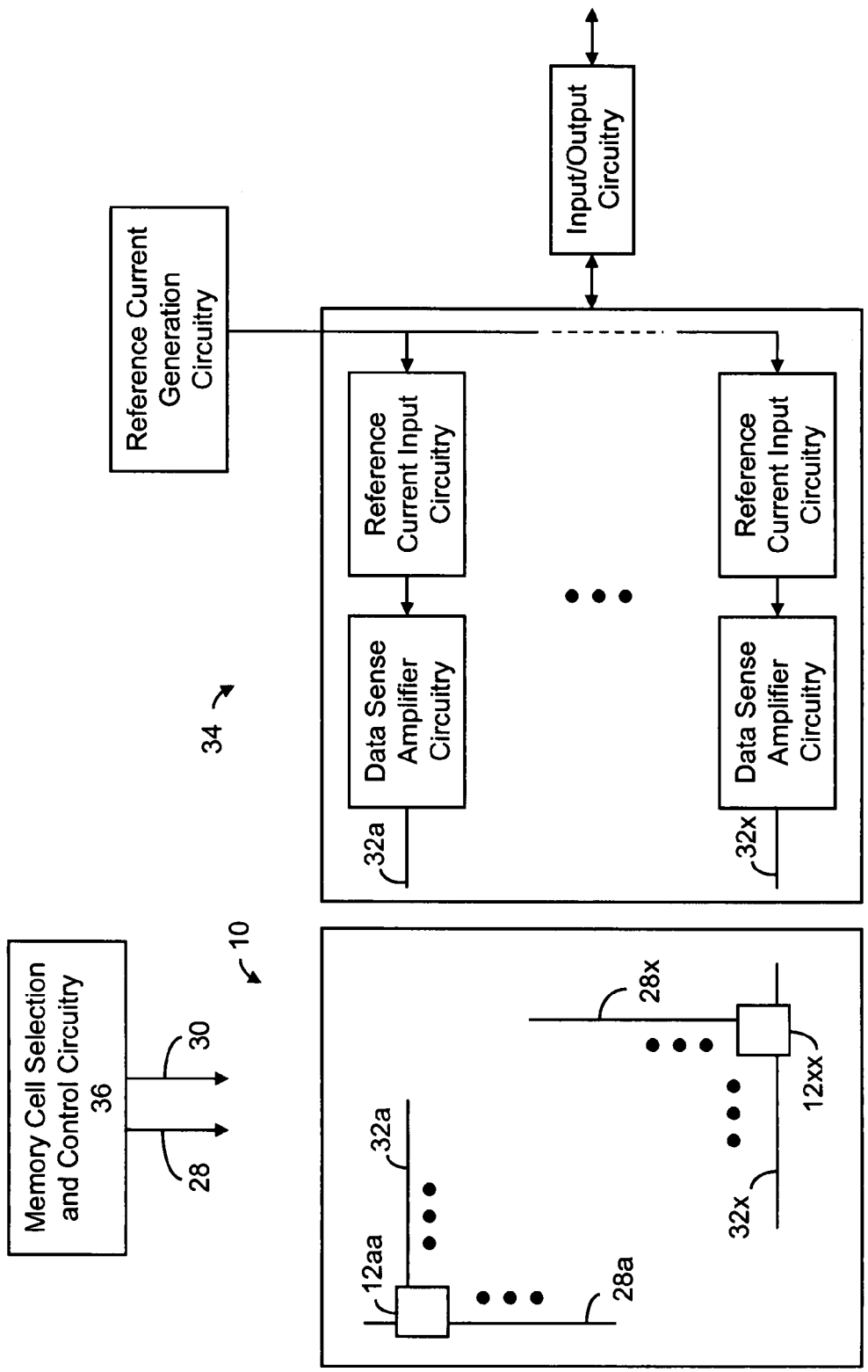

For example, with reference to FIGS. 7A and 7B, the integrated circuit device includes array 10, having a plurality of memory cells 12, data write and sense circuitry 34, and memory cell selection and control circuitry 36. The data write and sense circuitry 34 writes data into and senses the data state of one or more memory cells 12. The memory cell selection and control circuitry 36 selects and/or enables one or more predetermined memory cells 12 to be read by data sense circuitry 34.

The memory array 10 may be implemented using any number of architectures, layouts, and/or configurations employing electrically floating body memory cells 12. In this regard, an electrically floating body transistor, which state is read using the techniques of the present invention, may be implemented in the memory cell, architecture, layout, structure and/or configuration described and illustrated in the following non-provisional and provisional U.S. patent applications:

(1) Application Ser. No. 10/450,238, which was filed by Fazan et al. on Jun. 10, 2003 and entitled "Semiconductor Device";

(2) Application Ser. No. 10/487,157, which was filed by Fazan et al. on Feb. 18, 2004 and entitled "Semiconductor Device";

(3) Application Ser. No. 10/829,877, which was filed by Ferrant et al. on Apr. 22, 2004 and entitled "Semiconductor Memory Cell, Array, Architecture and Device, and Method of Operating Same";

(4) Application Ser. No. 10/840,009, which was filed by Ferrant et al. on May 6, 2004 and entitled "Semiconductor Memory Device and Method of Operating Same"

(5) Application Ser. No. 10/941,692, which was filed by Fazan et al. on Sep. 15, 2004 and entitled "Low Power Programming Technique for a One Transistor SOI Memory Device & Asymmetrical Electrically Floating Body Memory Device, and Method of Manufacturing Same"; and (6) Application Ser. No. 60/662,923, which was filed by Carman on Mar. 17, 2005 and entitled "Memory Device/Array Having Electrically Floating Body Memory Cells, and Method of Operating Same".

The entire contents of these six (6) U.S. patent applications, including, for example, the inventions, features, attributes, architectures, configurations, materials, techniques and advantages described and illustrated therein, are hereby incorporated by reference herein. For the sake of brevity, those discussions will not be repeated; rather those discussions (text and illustrations), including the discussions relating to the memory cell, architecture, layout, structure, are incorporated by reference herein in its entirety.

Notably, the memory cells may be controlled (for example, programmed or read) using any of the control circuitry described and illustrated in the above-referenced six (6) U.S. patent applications. For the sake of brevity, those discussions will not be repeated; such control circuitry is incorporated herein by reference. Indeed, all memory cell selection and control circuitry for programming, reading, controlling and/or operating memory cells including electrically floating body transistors, whether now known or later developed, are intended to fall within the scope of the present invention.

For example, the present invention may also employ the read circuitry and techniques described and illustrated in U.S. patent application Ser. No. 10/840,902, which was filed by Portmann et al. on May 7, 2004, and entitled "Reference Current Generator, and Method of Programming, Adjusting and/or Operating Same".

Moreover, the data write and sense circuitry 34 may include a sense amplifier (see, FIG. 7B) to read the data stored in memory cells 12. The sense amplifier (for example, a cross-coupled sense amplifier as described and illustrated in the Non-Provisional U.S. Patent Application filed by Waller and Carman, on Dec. 12, 2005 and entitled "Sense Amplifier Circuitry and Architecture to Write Data into and/or Read from Memory Cells", the application being incorporated herein by reference in its entirety) may sense the data state stored in memory cell 12 using voltage or current sensing circuitry and/or techniques. In the context of a current sense amplifier, the current sense amplifier may compare the cell current to a reference current, for example, the current of a reference cell (see, generally, FIG. 7B). From that comparison, it may be determined whether memory cell 12 contained a logic high (relatively more majority carries 34 contained within body region 18) or logic low data state (relatively less majority carries 28 contained within body region 18). Such circuitry and configurations thereof are well known in the art.

In addition, the present invention may employ the reference generation techniques (used in conjunction with the data sense circuitry for the read operation) described and illustrated in U.S. Provisional Patent Application Ser. No. 60/718,417, which was filed by Bauser on Sep. 19, 2005, and entitled "Method and Circuitry to Generate a Reference Current for Reading a Memory Cell Having an Electrically Floating Body Transistor, and Device Implementing Same". The entire contents of the U.S. Provisional Patent Application Ser. No. 60/718,417 are incorporated herein by reference.

It should be further noted that while each memory cell 12 in the exemplary embodiments (described above) includes one transistor 14, memory cell 12 may include two transistors, as described and illustrated in application Ser. No. 10/829,877, which was filed by Ferrant et al. on Apr. 22, 2004 and entitled "Semiconductor Memory Cell, Array, Architecture and Device, and Method of Operating Same".

The electrically floating memory cells, transistors and/or memory array(s) may be fabricated using well known techniques and/or materials. Indeed, any fabrication technique and/or material, whether now known or later developed, may be employed to fabricate the electrically floating memory cells, transistors and/or memory array(s). For example, the present invention may employ silicon (whether bulk-type or SOI), germanium, silicon/germanium, gallium arsenide or any other semiconductor material in which transistors may be formed. Indeed, the electrically floating transistors, memory cells, and/or memory array(s) may employ the techniques described and illustrated in non-provisional patent application entitled "Integrated Circuit Device, and Method of Fabricating Same", which was filed on Jul. 2, 2004, by Fazan, Ser. No. 10/884,481, provisional patent application entitled "One Transistor Memory Cell having Mechanically Strained Electrically Floating Body Region, and Method of Operating Same", which was filed on Oct. 19, 2005, Ser. No. 60/728,060, by Bassin, and/or provisional patent application entitled "Memory Cell, Array and Device, and Method of Operating Same", which was filed on Oct. 19, 2005, Ser. No. 60/728,061, by Okhonin et al. (hereinafter collectively "Integrated Circuit Device Patent Applications"). The entire contents of the Integrated Circuit Device Patent Applications, including, for example, the inventions, features, attributes, architectures, configurations, materials, techniques and advantages described and illustrated therein, are hereby incorporated by reference herein.

Indeed, memory array 10 (including SOI memory transistors) may be integrated with SOI logic transistors, as described and illustrated in the Integrated Circuit Device Patent Applications. For example, in one embodiment, an integrated circuit device includes memory section (having, for example, PD or FD SOI memory transistors 14) and logic section (having, for example, high performance transistors, such as FinFET, multiple gate transistors, and/or non-high performance transistors (for example, single gate transistors that do not possess the performance characteristics of high performance transistors—not illustrated)). Again, the entire contents of the Integrated Circuit Device Patent Applications, including, for example, the inventions, features, attributes, architectures, configurations, materials, techniques and advantages described and illustrated therein, are hereby incorporated by reference.

Further, the memory arrays may be comprised of N-channel, P-channel and/or both types of transistors, as well as partially depleted and/or fully depleted type transistors. For example, circuitry that is peripheral to the memory array (for example, sense amplifiers or comparators, row and column address decoders, as well as line drivers (not illustrated herein)) may include fully depleted type transistors (whether P-channel and/or N-channel type). Alternatively, such circuitry may include partially depleted type transistors (whether P-channel and/or N-channel type). There are many techniques to integrate both partially depleted and/or fully depleted type transistors on the same substrate (see, for example, application Ser. No. 10/487,157, which was filed by Fazan et al. on Feb. 18, 2004 and entitled "Semiconductor Device"). All such techniques, whether now known or later developed, are intended to fall within the scope of the present inventions.

Notably, electrically floating body transistor 14 may be a symmetrical or non-symmetrical device. Where transistor 14 is symmetrical, the source and drain regions are essentially interchangeable. However, where transistor 14 is a non-symmetrical device, the source or drain regions of transistor 14 have different electrical, physical, doping concentration and/or doping profile characteristics. As such, the source or drain regions of a non-symmetrical device are typically not interchangeable. This notwithstanding, the drain region of the electrically floating N-channel transistor of the memory cell (whether the source and drain regions are interchangeable or not) is that region of the transistor that is connected to the bit line/sense amplifier.

As mentioned above, the memory arrays may be comprised of N-channel, P-channel and/or both types of transistors. Indeed, circuitry that is peripheral to the memory array (for example, sense amplifiers or comparators, row and column address decoders, as well as line drivers (not illustrated herein)) may include P-channel and/or N-channel type transistors. Where P-channel type transistors are employed as memory cells 12 in the memory array(s), suitable write and read voltages (for example, negative voltages) are well known to those skilled in the art in light of this disclosure. Accordingly, for sake of brevity, these discussions will not be repeated.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

For example, as mentioned above, the illustrated/exemplary voltage levels to implement the read and write operations are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.1, 0.15, 0.25, 0.5, 1 volt) whether one or more of the voltages (for example, the source, drain or gate voltages) become or are positive and negative.

Notably, the present inventions may employ the circuitry and techniques for independently controlling certain parameters (for example, temporal or voltage), for a memory operation (for example, restore, write, refresh), to program or write a predetermined data state into a memory cell (for example, programming or writing data state "1" or "0" into a memory cell) as described and illustrated in U.S. Provisional Patent Application Ser. No. 60/731,668, which was filed by Popoff on Oct. 31, 2005, and entitled "Method and Apparatus for Varying the Programming Duration of a Floating Body Transistor, and Memory Cell, Array, and/or Device Implementing Same". For example, the duration of programming/writing of a given memory state into a memory cell by the data sense amplifier circuitry may be controlled adjusted, determined and/or predetermined according to or based on the given memory operation (for example, restore, write, refresh).

Likewise, the voltage conditions applied to the memory cell for programming/writing a given memory state into a memory cell by the data sense amplifier circuitry may be controlled and/or adjusted according to the memory operation (for example, restore, write, refresh). The entire contents of U.S. Provisional Patent Application Ser. No. 60/731,668, including, for example, the inventions, features, attributes, architectures, configurations, materials, techniques and advantages described and illustrated therein, are hereby incorporated by reference herein.

As mentioned above, each of the aspects of the present inventions, and/or embodiments thereof, may be employed alone or in combination with one or more of such aspects and/or embodiments. For the sake of brevity, those permutations and combinations will not be discussed separately herein. As such, the present inventions are neither limited to any single aspect (nor embodiment thereof), nor to any combinations and/or permutations of such aspects and/or embodiments.

Moreover, the above embodiments of the present inventions are merely exemplary embodiments. They are not intended to be exhaustive or to limit the inventions to the precise forms, techniques, materials and/or configurations disclosed. Many modifications and variations are possible in light of the above teaching. It is to be understood that other embodiments may be utilized and operational changes may be made without departing from the scope of the present inventions. As such, the foregoing description of the exemplary embodiments of the inventions has been presented for the purposes of illustration and description. Many modifications and variations are possible in light of the above teaching. It is intended that the scope of the inventions not be limited solely to the description above.

What is claimed is:

1. An integrated circuit device comprising:
    a memory cell consisting essentially of an electrically floating body transistor, wherein the electrically floating body transistor comprises:
        a source region;
        a drain region;
        a body region disposed between the source region and the drain region, wherein the body region is electrically floating; and
        a gate disposed over the body region;
    circuitry, coupled to the memory cell, to write a data state into the memory cell and to read the data state of the memory cell;
    wherein, in response to write control signals applied to the electrically floating body transistor, the electrically floating body transistor stores a charge which is representative of a data state of the memory cell in the body region of the electrically floating body transistor; and
    wherein, in response to read control signals applied to the electrically floating body transistor, the electrically floating body transistor generates a bipolar transistor current which is representative of the data state of the memory cell and wherein the circuitry determines the data state of the memory cell based on a signal which is representative of the bipolar transistor current of the electrically floating body transistor.

2. The integrated circuit device of claim 1 wherein electrically floating body transistor is an N-channel type transistor or a P-channel type transistor.

3. The integrated circuit device of claim 1 wherein electrically floating body transistor is non-symmetrical.

4. The integrated circuit device of claim 1 wherein the read control signals include signals applied to the gate, source region, and drain region to cause, force and/or induce the bipolar transistor current which is representative of the data state of the memory cell.

5. The integrated circuit device of claim 4 wherein the read control signals include a positive voltage pulse which is applied to the drain region of the electrically floating body transistor and wherein the circuitry is connected to the drain region via a bit line.

6. The integrated circuit device of claim 4 wherein the read control signals include a negative voltage pulse which is applied to the drain region of the electrically floating body transistor and wherein the circuitry is connected to the drain region via a bit line.

7. The integrated circuit of claim 1 wherein, if the memory cell stores a logic low, the electrically floating body transistor, in response to the read control signals applied thereto, generates a bipolar transistor current equal to or substantially equal to zero.

8. The integrated circuit of claim 1 wherein the signal which is representative of the bipolar transistor current of the electrically floating body transistor is a voltage amplitude.

9. An integrated circuit device comprising:
    a memory cell consisting essentially of an electrically floating body transistor, wherein the electrically floating body transistor comprises of:
        a first region having impurities to provide a first conductivity type;
        a second region having impurities to provide the first conductivity type;
        a body region disposed between the first region and the second region wherein the body region is electrically floating and includes impurities to provide a second conductivity type wherein the second conductivity type is different from the first conductivity type; and
        a gate disposed over the body region;
    circuitry, coupled to the memory cell, to write a data state into the memory cell and to read the data state of the memory cell;
    wherein, in response to the write control signals applied to the electrically floating body transistor, the electrically floating body transistor stores a charge which is representative of the data state in the body region of the electrically floating body transistor; and
    wherein, in response to the read control signals, the electrically floating body transistor generates a bipolar transistor current which is representative of the data state of the memory cell and wherein the circuitry determines the data state of the memory cell based on a signal which is representative of the bipolar transistor current of the electrically floating body transistor.

10. The integrated circuit device of claim 9 wherein electrically floating body transistor is an N-channel type transistor or a P-channel type transistor.

11. The integrated circuit device of claim 9 wherein electrically floating body transistor is non-symmetrical.

12. The integrated circuit device of claim 9 wherein the read control signals include signals applied to the gate, first region, and second region to cause, force and/or induce the bipolar transistor current which is representative of the data state of the memory cell.

13. The integrated circuit device of claim 12 wherein the read control signals include a positive voltage pulse which is applied to the second region of the electrically floating body transistor and wherein circuitry is connected to the second region via a bit line.

14. The integrated circuit device of claim 12 wherein the read control signals include a negative voltage pulse which is applied to the second region of the electrically floating body transistor and wherein the circuitry is connected to the second region via a bit line.

15. The integrated circuit of claim 9 wherein, if the memory cell stores a logic low, the electrically floating body transistor, in response to the read control signals applied thereto, generates a bipolar transistor current equal to or substantially equal to zero.

16. The integrated circuit of claim 9 wherein the signal which is representative of the bipolar transistor current of the electrically floating body transistor is a voltage amplitude.

17. An integrated circuit device comprising:
a memory cell consisting essentially of an electrically floating body transistor, wherein the electrically floating body transistor is disposed in or on a semiconductor region or layer which resides on or above an insulating region or layer of a substrate, the electrically floating body transistor comprises:
  a source region having impurities to provide a first conductivity type;
  a drain region having impurities to provide the first conductivity type,
  a body region disposed between the source region, the drain region and the insulating region or layer of the substrate, wherein the body region is electrically floating and includes impurities to provide a second conductivity type wherein the second conductivity type is different from the first conductivity type; and
  a gate spaced apart from the body region;
circuitry, coupled to the memory cell, to (i) read a data state of the memory cell and (ii) generate and apply read control signals to the electrically floating body transistor; and
wherein, in response to the read control signals, the electrically floating body transistor generates a bipolar transistor current which Is representative of the data state of the memory cell and wherein the circuitry determines the data state of the memory cell based on a signal which is representative of the bipolar transistor current of the electrically floating body transistor.

18. The integrated circuit device of claim 17 wherein electrically floating body transistor is an N-channel type transistor or a P-channel type transistor.

19. The integrated circuit device of claim 17 wherein electrically floating body transistor is non-symmetrical.

20. The integrated circuit device of claim 17 wherein the read control signals include signals applied to the gate, source region, and drain region to cause, force and/or induce the bipolar transistor current which is representative of the data state of the memory cell.

21. The integrated circuit device of claim 20 wherein the read control signals include a positive voltage pulse which is applied to the drain region of the electrically floating body transistor and wherein the circuitry is connected to the drain region via a bit line.

22. The integrated circuit device of claim 20 wherein the read control signals include a negative voltage pulse which is applied to the drain region of the electrically floating body transistor and wherein the circuitry is connected to the drain region via a bit line.

23. The integrated circuit of claim 17 wherein, if the memory cell stores a logic low, the electrically floating body transistor, in response to the read control signals applied thereto, generates a bipolar transistor current equal to or substantially equal to zero.

24. The integrated circuit of claim 17 wherein the signal which is representative of the bipolar transistor current of the electrically floating body transistor is a voltage amplitude.

25. A method of operating an integrated circuit device having a memory cell comprising an electrically floating body transistor, wherein the electrically floating body transistor comprises: (i) a source region, (ii) a drain region, (iii) a body region disposed between the source region and the drain region, wherein the body region is electrically floating, and (iv) a gate disposed over the body region, the method comprises:
applying read control signals to the electrically floating body transistor of the memory cell, wherein, in response to the read control signals, the electrically floating body transistor generates a bipolar transistor current which is representative of a data state of stored in the memory cell;
generating a voltage, having an amplitude, using the bipolar transistor current;
determining the data state of the memory cell based on the amplitude of the voltage which is representative of an amount of the bipolar transistor current generated by the electrically floating body transistor; and
outputting the data state of the memory cell.

26. The method of claim 25 further including applying write control signals to the electrically floating body transistor of the memory cell, wherein in response to the write control signals the electrically floating body transistor stores a charge which is representative of a data state in the body region of the electrically floating body transistor.

27. The method of claim 25 wherein the read control signals include a positive voltage pulse which is applied to the drain region of the electrically floating body transistor.

28. The method of claim 25 wherein the read control signals include a negative voltage pulse which is applied to the drain region of the electrically floating body transistor.

29. The method of claim 25 wherein, if the memory cell stores a logic low, the electrically floating body transistor, in response to the read control signals, generates a bipolar transistor current equal to or substantially equal to zero.

30. A method of operating an integrated circuit device having a memory cell comprising an electrically floating body transistor, wherein the electrically floating body transistor comprises: (i) a source region, (ii) a drain region, (iii) a body region disposed between the source region and the drain region, wherein the body region is electrically floating, and (iv) a gate disposed over the body region, the method comprises:
applying write control signals to the electrically floating body transistor of the memory cell, wherein, in response to the write control signals, the electrically floating body transistor stores a charge which is representative of a data state in the body region of the electrically floating body transistor; and
applying read control signals to the electrically floating body transistor of the memory cell, wherein, in response to the read control signals, the electrically floating body transistor generates a bipolar transistor current which is representative of a data state of stored in the memory cell.

31. The method of claim 30 wherein the read control signals include a positive or negative voltage pulse which is applied to the drain region of the electrically floating body transistor.

32. The method of claim 30 further including:
generating a voltage, having an amplitude, using the bipolar transistor current generated by the electrically floating body transistor in response to the read control signals;
determining the data state of the memory cell based on the amplitude of the voltage; and
outputting the data state of the memory cell.

33. The method of claim 32 wherein, if the memory cell stores a logic low, the electrically floating body transistor, in response to the read control signals, generates a bipolar transistor current equal to or substantially equal to zero.

* * * * *